US012590365B2

(12) United States Patent
Zong

(10) Patent No.: US 12,590,365 B2
(45) Date of Patent: Mar. 31, 2026

(54) HYDROPHILIC ANTI FOG FILM LAYER, PREPARATION METHOD THEREFOR, AND APPLICATION AND PRODUCT THEREOF

(71) Applicant: JIANGSU FAVORED NANOTECHNOLOGY CO., LTD., Wuxi (CN)

(72) Inventor: Jian Zong, Wuxi (CN)

(73) Assignee: JIANGSU FAVORED NANOTECHNOLOGY CO, , LTD., Wuxi (CN)

( * ) Notice: Subject to any disclaimer, the term of this patent is extended or adjusted under 35 U.S.C. 154(b) by 505 days.

(21) Appl. No.: 17/922,281

(22) PCT Filed: Apr. 30, 2021

(86) PCT No.: PCT/CN2021/091283
§ 371 (c)(1),
(2) Date: Oct. 28, 2022

(87) PCT Pub. No.: WO2021/219116
PCT Pub. Date: Nov. 4, 2021

(65) Prior Publication Data
US 2023/0183859 A1      Jun. 15, 2023

(30) Foreign Application Priority Data

Apr. 30, 2020      (CN) .......................... 202010364184.5

(51) Int. Cl.
C23C 16/40          (2006.01)
C23C 16/458          (2006.01)
C23C 16/505          (2006.01)
(52) U.S. Cl.
CPC ........ C23C 16/405 (2013.01); C23C 16/4584 (2013.01); C23C 16/505 (2013.01)
(58) Field of Classification Search
None
See application file for complete search history.

(56) References Cited

U.S. PATENT DOCUMENTS

| | | | | |
|---|---|---|---|---|
| 2007/0092734 A1* | 4/2007 | Durandeau | ........... | C23C 16/405 |
| | | | | 428/432 |
| 2008/0241479 A1* | 10/2008 | Nghiem | .............. | C03C 17/3417 |
| | | | | 428/218 |
| 2009/0110918 A1 | 4/2009 | Jacquiod et al. | | |
| 2022/0025194 A1* | 1/2022 | Kennedy | ................. | C09D 1/00 |

FOREIGN PATENT DOCUMENTS

| | | |
|---|---|---|
| CN | 101024168 | 8/2007 |
| CN | 101193705 | 6/2008 |
| CN | 102582137 | 7/2012 |
| CN | 102167524 | 4/2020 |
| CN | 111057998 | 4/2020 |
| CN | 111501015 | 8/2020 |
| KR | 20130015374 | 2/2013 |
| WO | WO 2012020295 | 2/2012 |

OTHER PUBLICATIONS

English translation of International Search Report issued in International Patent Application No. PCT/CN2021/091283, dated Jul. 28, 2021.
Duan et al., "Non-UV activated superhydrophilicity of patterned Fe-doped TiO2 film for anti-fogging and photocatalysis," *Applied Surface Science* (2018).

* cited by examiner

*Primary Examiner* — Sheeba Ahmed
(74) *Attorney, Agent, or Firm* — pH IP Law

(57) ABSTRACT

Provided are a hydrophilic anti-fog film layer, a preparation method therefor, and an application and a product thereof. The hydrophilic anti-fog film layer is prepared by means of a plasma chemical vapor deposition method by using a titanium dioxide precursor source and a non-metal doping source as reaction raw materials, has relatively good anti-fog performance under visible light, and has relatively good light transmittance.

17 Claims, No Drawings

HYDROPHILIC ANTI FOG FILM LAYER, PREPARATION METHOD THEREFOR, AND APPLICATION AND PRODUCT THEREOF

This application is a national phase application under 35 U.S.C. § 371 of International Application No. PCT/CN2021/091283, filed Apr. 30, 2021, which claims the priority to Chinese Patent Application No. 202010364184.5, filed Apr. 30, 2020. The contents of each of the above-referenced priority applications are hereby incorporated by reference.

TECHNICAL FIELD

The present disclosure relates to the field of anti-fog, in particular to a hydrophilic anti-fog film layer, a preparation method therefor, and an application and a product thereof.

BACKGROUND

Fogging is a common phenomenon in nature. When a temperature of a surface of a substrate is lower than a dew point of surrounding water vapor, saturated water vapor can be cooled rapidly and condenses into water droplets on the surface of the substrate. A light incident on the surface of the substrate will be refracted and reflected by the water droplets, resulting in a decrease in the transmittance of the substrate and the phenomenon of fogging.

In daily life, fogging may occur in glasses, lenses, windows, and the like. Fogging has a great impact on the transmittance of substrates such as glasses, lenses and car windows, which not only affects a work efficiency of substrates such as glasses, lenses and car windows, but also may cause dangers due to affecting sight. Therefore, the development of anti-fog film layer is of great significance.

At present, there are two main types of anti-fog coatings, one is a hydrophilic surface formed on the surface of the substrate, and water droplets on the hydrophilic surface spread to form a film; the other is a hydrophobic surface formed on the surface of the substrate, and water droplets on the hydrophobic surface form beads rolling off. The latter has a disadvantage that fogging still occurs when a large amount of water vapor condenses rapidly. For the former, a uniform water film is formed to eliminate the diffuse reflection of light and achieve the purpose of anti-fog.

Photocatalytic substances can be used for hydrophilic anti-fog film layer due to their hydrophilic properties after UV-light irradiation. However, the anti-fog film layer prepared by such photocatalytic substances is greatly limited in application. Titanium dioxide, a common photocatalytic substance, is taken as an example to illustrate. As an inorganic material, titanium dioxide has good chemical stability, wear resistance and low cost. However, only the UV-light with short wavelength can be absorbed by titanium dioxide due to titanium dioxide is a wide-band-gap semiconductor compound, and the UV-light is less abundant in the sunlight. In other words, titanium dioxide is less efficient in using sunlight.

Under UV-light irradiation, valence band electrons of titanium dioxide are excited to a conduction band, so a pair of electron holes on the surface is generated. Electrons react with $Ti^{4+}$, the holes react with bridge oxygen on the surface to be hydrophilic, and water molecules in the air decompose and are adsorbed in the oxygen vacancies to form hydroxyls on the surface, so that the surface can be provided with an anti-fog performance. When the UV-light is turned off, the hydroxyls on the surface are slowly replaced by oxygen in the air and will return to a hydrophobic state. If titanium dioxide is used as the hydrophilic anti-fog film layer, it is necessary to use UV-light to provide the hydrophilic anti-fog film layer with a hydrophilic anti-fog performance.

Obviously, this will limit the application of this type of anti-fog film layer. In the absence of UV-light, for example, in the dark, the hydrophilic anti-fog film layer of the photocatalytic substances will lose its anti-fog function.

SUMMARY

An advantage of the present disclosure is to provide a hydrophilic anti-fog film layer and a preparation method therefor, an application and a product thereof, wherein the hydrophilic anti-fog film layer is prepared by a photocatalytic substance and can play an anti-fog role without UV-light irradiation.

Another advantage of the present disclosure is to provide a hydrophilic anti-fog film layer and a preparation method therefor, an application and a product thereof, wherein the hydrophilic anti-fog film layer can be firmly combined with a substrate.

Another advantage of the present disclosure is to provide a hydrophilic anti-fog film layer and a preparation method therefor, an application and a product thereof, wherein the hydrophilic anti-fog film layer has high transparency.

Another advantage of the present disclosure is to provide a hydrophilic anti-fog film layer and a preparation method therefor, an application and a product thereof, wherein the hydrophilic anti-fog film layer can be formed on a variety of substrates, such as goggles, lenses, glass, etc.

Another advantage of the present disclosure is to provide a hydrophilic anti-fog film layer and a preparation method therefor, an application and a product thereof, wherein the hydrophilic anti-fog film layer can be applied to anti-fogging of a transparent substrate, and a transmittance of the hydrophilic anti-fog film layer itself can be greater than 90%.

Another advantage of the present disclosure is to provide a hydrophilic anti-fog film layer and a preparation method therefor, an application and a product thereof, wherein the hydrophilic anti-fog film layer has long-term anti-fog performance under visible light.

According to an aspect of the present disclosure, a hydrophilic anti-fog film layer is provided, which is formed on a surface of a substrate by a plasma chemical vapor deposition using a titanium dioxide precursor source and a non-metal doping source as reaction raw materials, wherein the titanium dioxide precursor source includes one or two selected from a group consisting of: a titanium-based source compound with an oxygen-based source, and a titanium-oxygen organic compound.

According to an embodiment of the present disclosure, the titanium-oxygen organic compound has a structural formula TiX, and X is an alkoxy group.

According to an embodiment of the present disclosure, the titanium-based source compound has a structural formula TiY, and Y is a halogen.

According to an embodiment of the present disclosure, the titanium-oxygen organic compound includes one or more selected from a group consisting of: tetrabutyl titanate, tetraisopropyl titanate, and ethyl titanate.

According to an embodiment of the present disclosure, the titanium-based source compound includes titanium tetrachloride.

According to an embodiment of the present disclosure, the oxygen-based source includes oxygen gas.

According to an embodiment of the present disclosure, the non-metal doping source includes a non-metal element including one or more selected from a group consisting of: C, N, F and S.

According to an embodiment of the present disclosure, the non-metal doping source includes one or more selected from a group consisting of: nitrogen gas ($N_2$), ammonia gas ($NH_3$), ethyne ($C_2H_2$), and octafluoropropane ($C_3F_8$).

According to an embodiment of the present disclosure, a contact angle of the hydrophilic anti-fog film layer under visible light is not greater than 10°.

According to an embodiment of the present disclosure, a thickness of the hydrophilic anti-fog film layer ranges from 20 nm to 10 μm, and a hardness of the hydrophilic anti-fog film layer is HB-4H.

According to an embodiment of the present disclosure, a light transmittance of the hydrophilic anti-fog film layer is greater than 90%.

According to an embodiment of the present disclosure, a preparation method of a hydrophilic anti-fog film layer is provided, which includes:

forming a hydrophilic anti-fog film layer on a surface of a substrate by a plasma chemical vapor deposition using a titanium dioxide precursor source and a non-metal doping source as reaction raw materials in a PECVD device, wherein the titanium dioxide precursor source includes one or two selected from a group consisting of: a titanium-based source compound with an oxygen-based source, and a titanium-oxygen organic compound.

According to an embodiment of the present disclosure, a product with a hydrophilic anti-fog film layer is provided, which is prepared by being exposed in an environment with a titanium dioxide precursor source and a non-metal doping source serving as reaction raw materials, wherein the hydrophilic anti-fog film layer is formed on at least a part of a surface of the product by a plasma chemical vapor deposition, wherein the titanium dioxide precursor source includes one or two selected from a group consisting of: a titanium-based source compound with an oxygen-based source, and a titanium-oxygen organic compound.

DETAILED DESCRIPTION

The following description serves to disclose the present disclosure to enable those skilled in the art to practice the present disclosure. The embodiments in the following description are only for exemplification. Those skilled in the art may think of other obvious variations. The basic principles of the present disclosure as defined in the following description may be applied to other embodiments, variations, modifications, equivalents, and other technical solutions without departing from the spirit and scope of the present disclosure.

It will be appreciated that the term "a", "an", or "one" is to be understood as "at least one" or "one or more", i.e., in one embodiment, the number of an element may be one and in another embodiment the number of the element may be multiple, and that the term "a", "an", or "one" is not to be construed to limit the number.

The present disclosure is to provide a hydrophilic anti-fog film layer and a preparation method therefor, an application and a product thereof, and the hydrophilic anti-fog film layer has good hydrophilicity. Water droplets can spread on a surface of the hydrophilic anti-fog film layer and form a relatively uniform water film which can reduce the diffuse reflection of light, so as to provide anti-fog function. When the hydrophilic anti-fog film layer is attached to a surface of a substrate, the surface of the substrate will have a good anti-fog performance.

The hydrophilic anti-fog film layer itself has good light transmittance performance, which enables the hydrophilic anti-fog film layer to be applied to transparent substrates without too much affecting the light transmittance performance of the transparent substrates. The light transmittance of the hydrophilic anti-fog film layer can be greater than 90%.

In some embodiments of the present disclosure, the material of the substrate may be, but is not limited to, glass, metal, ceramic, plastic or polymer materials. Specifically, the substrate may be, but is not limited to, goggles, laser protective goggles, telescopes and lenses of various camera equipment, various mechanical observation windows, sports diving goggles, bathroom glass, chemical or biological protective masks, vehicle windshields and rear-view mirrors, explosive treatment protective equipment, helmets, solar panels, observation windows of measuring instruments, glass covers, glass walls of greenhouses, etc.

Further, a water contact angle of the hydrophilic anti-fog film layer can be less than 40°, such as 30°, 20°, 10° or less, and can be maintained for a long time without UV-light. For example, the contact angle stays at an original level after being placed under visible light for 6 months.

The hydrophilic anti-fog film layer has excellent wear resistance and can be firmly combined with the substrate. After being applied a load of 1 KG and rubbed with wet dust-free cloth for 2000 times, the contact angle can still stay at the original level. For example, the contact angle of the hydrophilic anti-fog film was 9° previously, after 6 months, the contact angle is still 9°, and the contact angle is still 9° after being applied a load of 1 KG and rubbed with a wet dust-free cloth for 2000 times.

The hydrophilic anti-fog film layer can be prepared to be of a smaller thickness. For example, the thickness ranges from 10 nm to 2000 nm.

According to some embodiments of the present disclosure, the hydrophilic anti-fog film layer is formed on the surface of the substrate by a plasma enhanced chemical vapor deposition (PECVD) process. That is to say, during the preparation process, the surface of the substrate is exposed in a chamber of a plasma enhanced chemical vapor deposition reaction device, plasma is formed in the chamber, and the hydrophilic anti-fog film layer is formed on the surface of the substrate by the deposition of raw materials.

The plasma enhanced chemical vapor deposition (PECVD) process has many advantages over other existing deposition processes: (1) dry deposition does not need to use organic solvents; (2) an etching effect of the plasma on the surface of the substrate makes a deposited film have good adhesion with the substrate; (3) the film can be deposited evenly on the surface of an irregular substrate with strong vapor permeability; (4) the coating has good designability, and compared with a micron-level control accuracy of the liquid-phase method, the chemical vapor method can control a thickness of the coating in nano scale; (5) the coating has a simple structure, the chemical vapor method uses plasma activation, and does not need to design a specific initiator to initiate composite coatings of different materials, and a variety of raw materials can be combined through adjusting input energy; (6) good compactness can be achieved, and the chemical vapor deposition method often activates multiple active sites in a process of plasma initiation, which is similar to the condition in which a molecule has multiple functional groups in solution reaction, and a cross-linked structure is formed between molecular chains through multiple functional groups; (7) as a coating treatment technology, it has excellent universality and wide selection range of coating objects and raw materials used for coating.

The plasma enhanced chemical vapor deposition (PECVD) process generates plasma through glow discharge. The discharge method may include a radio frequency discharge, a microwave discharge, an intermediate frequency discharge, a high frequency discharge, and an electric spark discharge. A waveform of the high frequency discharge and the intermediate frequency discharge may be sinusoidal or bipolar pulses.

The hydrophilic anti-fog film layer is prepared by a photocatalytic substance and is doped with a non-metal. The hydrophilic anti-fog film layer doped with the non-metal has good hydrophilicity under visible light. The non-metal may include C, N, F, S, B, P and halogen group elements. It should be understood that, the photocatalytic substance may be doped with a single non-metal, or doped with two or more non-metals, such as co-doped with C and N or co-doped with C, N, and S.

The photocatalytic substance can be a photocatalytic substance of the titanium dioxide type.

It should be noted that, in the present disclosure, titanium dioxide is not directly used as the photocatalytic substance, instead, a titanium dioxide precursor source is used for preparing the photocatalytic substance. The titanium dioxide precursor source may include a titanium-based source compound with an oxygen-based source, and the titanium-based source compound and the oxygen-based source can generate a titanium dioxide group in a plasma environment. The titanium dioxide precursor source may include a titanium-oxygen organic compound which can generate a titanium dioxide group in a plasma environment.

The hydrophilic anti-fog film layer of the titanium dioxide type is prepared by a titanium dioxide precursor source under plasma conditions, and the hydrophilic anti-fog film layer has above-mentioned good hardness, light transmittance and hydrophilicity. The titanium dioxide precursor source and non-metal doping source are simultaneously introduced into a reaction chamber of a PECVD for reaction, which is conducive to doping the non-metal doping source between titanium atoms and oxygen atoms.

According to some embodiments of the present disclosure, the titanium-based source compound forming the hydrophilic anti-fog film layer has a structural formula TiY, where Ti may be tetravalent, and Y may be inorganic group, such as halogen. The titanium-based source compound may be titanium tetrachloride. The oxygen-based source may be oxygen gas or other oxygenated oxides.

The titanium-oxygen organic compound forming the hydrophilic anti-fog film layer has a structural formula TiX, and X may be an organic group, such as an alkoxy group. According to some embodiments of the present disclosure, TiX may include one or more selected from a group consisting of: tetrabutyl titanate, tetraisopropyl titanate and ethyl titanate.

It should be understood that, the titanium-based source compound, the oxygen-based source and the titanium-oxide organic compound can be simultaneously introduced into the reaction chamber of the PECVD device.

Elements of the non-metal source forming the hydrophilic anti-fog film layer may be C, N, F, S, B, P and halogen elements. The non-metal source may be a single substance or mixed substances. According to some embodiments of the present disclosure, the non-metal source may include one or more selected from a group consisting of: nitrogen gas ($N_2$), ammonia gas ($NH_3$), ethyne ($C_2H_2$), and octafluoropropane ($C_3F_8$).

According to some embodiments of the present disclosure, the non-metal source may be $C_xF_{2x+2}$ or $C_xF_{2x}$, where X may be a number ranging from 1 to 6. The non-metal source may be an alkane or an alkene.

Further, according to some embodiments of the present disclosure, the preparation process of the hydrophilic anti-fog film layer may include:

(1) pretreatment: the substrate is placed in the reaction chamber of the PECVD device, a plasma source gas is introduced after pumping, and a motion mechanism is started to make the substrate move in the reaction chamber;

(2) deposition: the titanium dioxide precursor source and the non-metal doping source are introduced into the reaction chamber, and the plasma discharge is started for chemical vapor deposition; and (3) post-processing: the plasma discharge stops, an atmosphere is introduced to achieve an atmospheric pressure after pumping, and the substrate stops moving, then the substrate with the hydrophilic anti-fog film layer can be taken out.

It should be understood that the plasma source gas may be an inert gas or a non-metal doping source gas. For example, when the plasma source gas is nitrogen gas, the plasma source gas can also be used as the non-metal doping source.

According to some embodiments of the present disclosure, the overall preparation method of the hydrophilic anti-fog film layer may include the following steps:

(1) pretreatment: the substrate is placed in a reaction chamber of a nano coating preparation equipment, the reaction chamber is continuously pumped so that the vacuum degree in the reaction chamber is in a range of 10 mTorr to 200 mTorr, then the plasma source gas is introduced, and the movement mechanism is started to make the substrate move in the reaction chamber;

(2) the preparation of the hydrophilic anti-fog film layer: the following steps are performed to prepare the hydrophilic anti-fog film layer on the surface of the substrate:

the titanium-based source compound and the oxygen-based source with the non-metal doping source, or the titanium-oxygen organic compound and the non-metal doping source, or a mixture of the titanium-based source compound, the oxygen-based source and the titanium-oxygen organic compound with the non-metal doping source gas are introduced into the reaction chamber, when the vacuum degree in the reaction chamber achieves a range of 30 mTorr to 300 mTorr, the plasma discharge is started to perform a chemical vapor deposition;

the hydrophilic anti-fog film layer: the total thickness of the hydrophilic anti-fog film layer ranges from 20 nm to 10 μm, and the hardness of the hydrophilic anti-fog film layer is HB-4H.

(3) post-processing:

the plasma discharge stops, keep pumping to keep the vacuum degree in the reaction chamber in a range of 10 mTorr to 200 mTorr, after 1-5 min, the atmosphere is introduced to achieve an atmospheric pressure, the substrate stops moving, and then the substrate can be taken out. Alternatively, the plasma discharge stops, air or an inert gas is introduced into the reaction chamber to get a pressure in the reaction chamber to be in a range of 2000 mTorr to 5000 mTorr, and then pumping to get the pressure to be in a range of 10 mTorr to 200 mTorr.

Above steps of introducing and pumping are performed at least once, and air is introduced to get the pressure to achieve an atmospheric pressure, then the movement of the substrate stops and the substrate can be taken out.

In the step (2), a flow rate of the titanium-based source compound or the titanium-oxygen organic compound may range from 10 μL/min to 1000 μL/min. In the step (2), a flow rate of the oxygen-based source may range from 2 sccm to 200 sccm, and a flow rate of the non-metal doping source may range from 2 sccm to 200 sccm.

In the step (2), the titanium-based source compound forming the hydrophilic anti-fog film layer has a structural formula TiY, where Ti may be tetravalent, and Y may be inorganic group, such as halogen.

In the step (2), the titanium-based source compound may be titanium tetrachloride.

In the step (2), the titanium-oxygen organic compound has a structural formula TiX, and X may be an organic oxygenated group, such as an alkoxy group.

In the step (2), the titanium-oxygen organic compound may include one or more selected from a group consisting of: tetrabutyl titanate, tetraisopropyl titanate, ethyl titanate and methyl titanate.

In the step (2), the non-metals of the non-metal doping source may include one or more selected from a group consisting of: C, N, F, S, B, P and halogen group elements.

In the step (2), the non-metal doping source may be $C_xF_{2x+2}$ or $C_xF_{2x}$, and X may be a number ranging from 1 to 6. The non-metal source may be an alkane or an alkene.

In the step (2), the non-metal doping source may include one or more selected from a group consisting of: nitrogen gas ($N_2$), ammonia gas ($NH_3$), ethyne ($C_2H_2$), and octafluoropropane ($C_3F_8$).

In the step (1), the plasma source gas may be inert gas, such as He and/or Ar, or a non-metal doping source that can be used as a plasma source, such as nitrogen gas or fluorocarbon compounds.

In the step (2), the inert gas, such as He, can still be introduced with a flow rate ranging from 2 sccm to 200 sccm.

In the step (1), the substrate may have a motion in the reaction chamber. The motion mode of the substrate may be a rectilinear reciprocating motion relative to the reaction chamber or a curvilinear motion relative to the reaction chamber. The curvilinear motion may include a circular motion, an elliptical motion, a planetary motion, a spherical motion and other curvilinear motions of irregular routes.

In the step (1), the reaction chamber may be a rotary chamber or a cubic chamber, a volume of the reaction chamber may be in a range of 50 L to 1000 L, a temperature of the reaction chamber can be controlled in a range of 30° C. to 60° C., and a flow rate of the inert gas may range from 5 sccm to 300 sccm.

In the step (2), the plasma discharge is used for the chemical vapor deposition. The plasma discharge process during deposition may be a continuous discharge or a pulse discharge, and detailly includes at least one time of the following deposition process: the deposition process includes the pretreatment stage and the coating stage. In the pretreatment stage, a plasma discharge power ranges from 150 W to 600 W, and a discharge duration time ranges from 60 s to 450 s. Then, in the coating stage, the plasma discharge power is adjusted to range from 10 W to 200 W, and the discharge duration time ranges from 600 s to 7200 s.

In the step (2), the plasma discharge may include a radio frequency discharge, a microwave discharge, an intermediate frequency discharge, a high frequency discharge, and an electric spark discharge. The waveforms of the high frequency discharge and intermediate frequency discharge are sinusoidal or bipolar pulses.

In the step (1), the substrate may be a product with anti-fog requirements and high surface energy treatment requirements made of metal, glass or polymer. The substrate may include, but is not limited to, goggles, laser protective goggles, telescopes and lenses of various camera equipment, various mechanical observation windows, sports diving goggles, bathroom glass, chemical or biological protective masks, vehicle windshields and rear-view mirrors, explosive treatment protective equipment, helmets, solar panels, observation windows of measuring instruments, glass covers, glass walls of greenhouses, etc.

Compared with a coating undoped titanium dioxide, the hydrophilic anti-fog film layer has long-term hydrophilicity under visible light without UV-light. The water contact angle can be less than 10°, and the super hydrophilicity still remains after 6 months. After being applied a load of 1 KG and rubbed with wet dust-free cloth for 2000 times, the contact angle is still less than 10°. The hydrophilic anti-fog film layer has excellent anti-fog performance, and the light transmittance is greater than 90%, thus the hydrophilic anti-fog film layer can be applied in the anti-fog condition of transparent substrates.

By non-metal doping $TiO_2$ having photocatalytic property to reduce a band gap width, the hydrophilic anti-fog film layer can realize a super hydrophilic anti-fog performance under visible light. The hydrophilic anti-fog film layer of $TiO_2$ type doped with non-metal elements has long-term hydrophilicity under visible light, and the water contact angle is less than 10°. The super hydrophilicity still remains after 6 months. After being applied a load of 1 KG and rubbed with wet dust-free cloth for 2000 times, the contact angle is still less than 10°. The hydrophilic anti-fog film layer has excellent anti-fog performance, and the light transmittance is greater than 90%, thus the hydrophilic anti-fog film layer can be applied in the anti-fog condition of transparent substrates.

The hydrophilic anti-fog film layer can improve the anti-fog performance of the surface of the substrate, and the anti-fog method of the surface of the substrate may be: the substrate is exposed in an environment with a titanium dioxide precursor source and a non-metal doping source serving as reaction raw materials, and a hydrophilic anti-fog film layer is formed on at least a part of the surface of the substrate by a plasma chemical vapor deposition.

The hydrophilic anti-fog film layer can be formed on a surface of a product to improve the anti-fog performance of the product. For example, the product with the hydrophilic anti-fog film layer may be prepared by being exposed in an environment with a titanium source, an oxygen source and a non-metal doping source serving as reaction raw materials, and the hydrophilic anti-fog film layer is formed on at least a part of the surface of the product by a plasma chemical vapor deposition.

Embodiment 1

In this embodiment, the total thickness of a N-doped titanium dioxide anti-fog film layer prepared by a plasma enhanced chemical vapor deposition process is about 100 nm.

The hydrophilic anti-fog film layer can be prepared according to the following steps:
(1) Pretreatment:

A substrate is placed in a reaction chamber of a nano coating preparation equipment, and the reaction chamber is closed. Continuously pumping the reaction chamber to control a vacuum degree in the reaction chamber to be 10 mTorr, and a plasma source gas—inert gas Ar is introduced into the reaction chamber. Then, a movement mechanism is started to make the substrate move in the reaction chamber.

In the step (1), the substrate is a product with anti-fog requirements and high surface energy treatment requirements made of metal, glass or polymer.

In the step (1), the reaction chamber is a rotary chamber with a volume of 500 L, the temperature of the reaction chamber is controlled at 45° C., and the flow rate of the inert gas is 60 sccm.

In the step (1), the substrate moves in the reaction chamber in the form of a circular motion relative to the reaction chamber, and the rotation speed is 6 revolutions/min.

(2) The Preparation of the N-Doped Titanium Dioxide Hydrophilic Anti-Fog Film Layer:

Tetrabutyl titanate (the titanium-oxygen organic compound of the titanium dioxide precursor source) and nitrogen gas (the non-metal doping source) are introduced into the reaction chamber. When the vacuum degree in the reaction chamber achieves 30 mTorr, the plasma discharge is started to perform a chemical vapor deposition to prepare the hydrophilic anti-fog film layer on the surface of the substrate.

The tetrabutyl titanate is a monomer vapor, which is formed by atomizing and volatilizing the monomer by a feeding pump and can be introduced into the reaction chamber under a low pressure of 10 mTorr. The flow rate of the monomer vapor is 120 μL/min; and the flow rate of the nitrogen gas is 60 sccm.

In the step (2), the plasma discharge is used for the chemical vapor deposition. The plasma discharge process during the deposition is a continuous discharge, which specifically includes at least one time of following deposition process: the deposition process includes the pretreatment stage and the coating stage. In the pretreatment stage, the plasma discharge power is 300 W, and the discharge duration time is 450 s. Then in the coating stage, the plasma discharge power is adjusted to be 200 W, and the discharge duration time is 3600 s.

In the step (2), the plasma discharge mode is a radio frequency discharge.

(3) Post-Processing:

The introduction of the monomer vapor stops, and the plasma discharge stops at the same time. Continuously pumping to keep the vacuum degree of the reaction chamber to be 10 mTorr. After one minute, air is introduced to control the pressure in the reaction chamber to be an atmospheric pressure, and then the substrate is taken out.

Embodiment 2

In this embodiment, the total thickness of the C-doped titanium dioxide anti-fog film layer prepared by the plasma enhanced chemical vapor deposition process is about 90 nm.

The hydrophilic anti-fog film layer can be prepared according to the following steps:

(1) Pretreatment:

A substrate is placed in the reaction chamber of the nano coating preparation equipment, and the reaction chamber is closed. Continuously pumping the reaction chamber to control the vacuum degree in the reaction chamber to be 10 mTorr, and the inert gas He is introduced into the reaction chamber. Then, the movement mechanism is started to make the substrate move in the reaction chamber.

In the step (1), the substrate is a product with anti-fog requirements and high surface energy treatment requirements made of metal, glass or polymer.

In the step (1), the reaction chamber is a rotary chamber with a volume of 200 L, the temperature of the reaction chamber is controlled at 45° C., and the flow rate of the inert gas is 60 sccm.

In the step (1), the substrate moves in the reaction chamber in the form of a circular motion relative to the reaction chamber, and the rotation speed is 6 revolutions/min.

(2) The Preparation of the C-Doped Titanium Dioxide Hydrophilic Anti-Fog Film Layer:

Tetraisopropyl titanate (the titanium-oxygen organic compound of the titanium dioxide precursor source) and ethyne (the non-metal doping source) are introduced into the reaction chamber. When the vacuum degree in the reaction chamber achieves 30 mTorr, the plasma discharge is started to perform the chemical vapor deposition to prepare the hydrophilic anti-fog film layer on the surface of the substrate.

The tetraisopropyl titanate is a monomer vapor, which is formed by atomizing and volatilizing the monomer by a feeding pump and can be introduced into the reaction chamber under a low pressure of 10 mTorr. The flow rate of the monomer vapor is 110 μL/min; and the flow rate of the ethyne is 40 sccm.

In the step (2), the plasma discharge is used for the chemical vapor deposition. The plasma discharge process during the deposition is a continuous discharge, which specifically includes at least one time of following deposition process: the deposition process includes the pretreatment stage and the coating stage. In the pretreatment stage, the plasma discharge power is 300 W, and the discharge duration time is 450 s. Then in the coating stage, the plasma discharge power is adjusted to be 200 W, and the discharge duration time is 3600 s.

In the step (2), the plasma discharge mode is a radio frequency discharge.

(3) Post-Processing:

The introduction of the monomer vapor stops, and the plasma discharge stops at the same time. Continuously pumping to keep the vacuum degree of the reaction chamber to be 10 mTorr. After one minute, air is introduced to get the pressure in the reaction chamber to be an atmospheric pressure, and then the substrate is taken out.

Embodiment 3

In this embodiment, the total thickness of the F-doped titanium dioxide anti-fog film layer prepared by the plasma enhanced chemical vapor deposition process is about 120 nm.

The hydrophilic anti-fog film layer can be prepared according to the following steps:

(1) Pretreatment:

A substrate is placed in the reaction chamber of the nano coating preparation equipment, and the reaction chamber is closed. Continuously pumping the reaction chamber to control the vacuum degree in the reaction chamber to be 10 mTorr, and inert gases He and Ar are introduced into the reaction chamber. Then, the movement mechanism is started to make the substrate move in the reaction chamber.

In the step (1), the substrate is a product with anti-fog requirements and high surface energy treatment requirements made of metal, glass or polymer.

In the step (1), the reaction chamber is a rotary chamber with a volume of 50 L, the temperature of the reaction chamber is controlled at 45° C., and the flow rate of the inert gases is 60 sccm.

In the step (1), the substrate moves in the reaction chamber in the form of a circular motion relative to the reaction chamber, and the rotation speed is 6 revolutions/min.

(2) The Preparation of the F-Doped Titanium Dioxide Hydrophilic Anti-Fog Film Layer:

Ethyl titanate (the titanium-oxygen organic compound of the titanium dioxide precursor source) and octafluoropropane (the non-metal doping source) are introduced into the reaction chamber. When the vacuum degree in the reaction chamber achieves 30 mTorr, the plasma discharge is started to perform the chemical vapor deposition to prepare the hydrophilic anti-fog film layer on the surface of the substrate.

The ethyl titanate is a monomer vapor, which is formed by atomizing and volatilizing the monomer by a feeding pump and can be introduced into the reaction chamber under a low pressure of 10 mTorr. The flow rate of the monomer vapor is 130 μL/min; and the flow rate of the octafluoropropane is 60 sccm.

In the step (2), the plasma discharge is used for the chemical vapor deposition. The plasma discharge process during deposition is a continuous discharge, which specifically includes at least one time of following deposition process: the deposition process includes the pretreatment stage and the coating stage. In the pretreatment stage, the plasma discharge power is 300 W, and the discharge duration time is 450 s. Then in the coating stage, the plasma discharge power is adjusted to be 200 W, and the discharge duration time is 3600 s.

In the step (2), the plasma discharge mode is a radio frequency discharge.

(3) Post-Processing:

The introduction of the monomer vapor stops, and the plasma discharge stops at the same time. Continuously pumping to keep the vacuum degree of the reaction chamber to be 10 mTorr. After one minute, air is introduced to get the pressure in the reaction chamber to be an atmospheric pressure, and then the substrate is taken out.

Embodiment 4

In this embodiment, the total thickness of the N-doped titanium dioxide anti-fog film layer prepared by the plasma enhanced chemical vapor deposition process is about 90 nm.

The hydrophilic anti-fog film layer can be prepared according to the following steps:

(1) Pretreatment:

A substrate is placed in the reaction chamber of the nano coating preparation equipment, and the reaction chamber is closed. Continuously pumping the reaction chamber to control the vacuum degree in the reaction chamber to be 10 mTorr, and the nitrogen gas is introduced into the reaction chamber. Then, the movement mechanism is started to make the substrate move in the reaction chamber.

In the step (1), the substrate is a product with anti-fog requirements and high surface energy treatment requirements made of metal, glass or polymer.

In the step (1), the reaction chamber is a rotary chamber with a volume of 1000 L, the temperature of the reaction chamber is controlled at 45° C., and the flow rate of the nitrogen gas is 30 sccm.

In the step (1), the substrate moves in the reaction chamber in the form of a circular motion relative to the reaction chamber, and the rotation speed is 7 revolutions/min.

(2) The Preparation of the N-Doped Titanium Dioxide Hydrophilic Anti-Fog Film Layer:

Methyl titanate (the titanium-oxygen organic compound of the titanium dioxide precursor source) and ammonia gas (the non-metal doping source) are introduced into the reaction chamber. When the vacuum degree in the reaction chamber achieves 30 mTorr, the plasma discharge is started to perform the chemical vapor deposition to prepare the hydrophilic anti-fog film layer on the surface of the substrate.

The methyl titanate is a monomer vapor, which is formed by atomizing and volatilizing the monomer by a feeding pump and can be introduced into the reaction chamber under a low pressure of 10 mTorr. The flow rate of the monomer vapor is 110 μL/min; and the flow rate of the ammonia gas is 40 sccm.

In the step (2), the plasma discharge is used for the chemical vapor deposition. The plasma discharge process during deposition is a continuous discharge, which specifically includes at least one time of the following deposition process: the deposition process includes the pretreatment stage and the coating stage. In the pretreatment stage, the plasma discharge power is 300 W, and the discharge duration time is 450 s. Then in the coating stage, the plasma discharge power is adjusted to be 200 W, and the discharge duration time is 3600 s.

In the step (2), the plasma discharge mode is a radio frequency discharge.

(3) Post-Processing:

The introduction of the monomer vapor stops, and the plasma discharge stops at the same time. Continuously pumping to keep the vacuum degree of the reaction chamber being 10 mTorr. After one minute, air is introduced to get the pressure in the reaction chamber to be an atmospheric pressure, and then the substrate is taken out.

It should be understood that the non-metal doping source can also be the plasma source gas, such as nitrogen gas, which can be used to provide a plasma environment in the pretreatment stage and used for doping as a non-metal in the deposition process.

Embodiment 5

In this embodiment, the total thickness of the F-doped titanium dioxide anti-fog film layer prepared by the plasma enhanced chemical vapor deposition process is about 20 nm.

The hydrophilic anti-fog film layer can be prepared according to the following steps:

(1) Pretreatment:

A substrate is placed in the reaction chamber of the nano coating preparation equipment, and the reaction chamber is closed. Continuously pumping the reaction chamber to control the vacuum degree in the reaction chamber to be 10 mTorr, and the inert gases He and Ar are introduced into the reaction chamber. Then, the movement mechanism is started to make the substrate move in the reaction chamber.

In the step (1), the substrate is a product with anti-fog requirements and high surface energy treatment requirements made of metal, glass or polymer.

In the step (1), the reaction chamber is a rotary chamber with a volume of 200 L, the temperature of the reaction chamber is controlled at 45° C., and the flow rate of the inert gases is 60 sccm.

In the step (1), the substrate moves in the reaction chamber in the form of a circular motion relative to the reaction chamber, and the rotation speed is 6 revolutions/min.

(2) The Preparation of the F-Doped Titanium Dioxide Hydrophilic Anti-Fog Film Layer:

Titanium tetrachloride (the titanium-oxygen organic compound of the titanium dioxide precursor source), oxygen gas (the oxygen-based source) and octafluoropropane (the non-metal doping source) are introduced into the reaction chamber. When the vacuum degree in the reaction chamber achieves 30 mTorr, the plasma discharge is started to perform the chemical vapor deposition to prepare the hydrophilic anti-fog film layer on the surface of the substrate.

The titanium tetrachloride is a monomer vapor, which is formed by atomizing and volatilizing the monomer by a feeding pump and can be introduced into the reaction chamber under a low pressure of 10 mTorr. The flow rate of the monomer vapor is 110 μL/min; the flow rate of the oxygen gas is 50 sccm; and the flow rate of the octafluoropropane is 60 sccm.

In the step (2), the plasma discharge is used for the chemical vapor deposition. The plasma discharge process during the deposition is a continuous discharge, which specifically includes at least one time of the following deposition process: the deposition process includes the pretreatment stage and the coating stage. In the pretreatment stage, the plasma discharge power is 300 W, and the discharge duration time is 450 s. Then in the coating stage, the plasma discharge power is adjusted to be 200 W, and the discharge duration time is 700 s.

In the step (2), the plasma discharge mode is an intermediate frequency discharge.

(3) Post-Processing:

The introduction of the monomer vapor stops, and the plasma discharge stops at the same time. Continuously pumping to keep the vacuum degree of the reaction chamber being 10 mTorr. After one minute, air is introduced to get the pressure in the reaction chamber to be an atmospheric pressure, and then the substrate is taken out.

Embodiment 6

In this embodiment, the total thickness of the N-doped and F-doped titanium dioxide anti-fog film layer prepared by the plasma enhanced chemical vapor deposition process is about 30 nm.

The hydrophilic anti-fog film layer can be prepared according to the following steps:

(1) Pretreatment:

A substrate is placed in the reaction chamber of the nano coating preparation equipment, and the reaction chamber is closed. Continuously pumping the reaction chamber to control the vacuum degree in the reaction chamber to be 10 mTorr, and the plasma source gas—the inert gas Ar is introduced into the reaction chamber. Then, the movement mechanism is started to make the substrate move in the reaction chamber.

In the step (1), the substrate is a product with anti-fog requirements and high surface energy treatment requirements made of metal, glass or polymer.

In the step (1), the reaction chamber is a rotary chamber with a volume of 100 L, the temperature of the reaction chamber is controlled at 45° C., and the flow rate of the inert gas is 60 sccm.

In the step (1), the substrate moves in the reaction chamber in the form of a circular motion relative to the reaction chamber, and the rotation speed is 6 revolutions/min.

(2) The Preparation of the N-Doped and F-Doped Titanium Dioxide Hydrophilic Anti-Fog Film Layer:

Tetrabutyl titanate (the titanium-oxygen organic compound of the titanium dioxide precursor source), and carbon octafluoride and nitrogen gas (the oxygen-based source) are introduced into the reaction chamber. When the vacuum degree in the reaction chamber achieves 30 mTorr, the plasma discharge is started to perform the chemical vapor deposition to prepare the hydrophilic anti-fog film layer on the surface of the substrate.

The tetrabutyl titanate is a monomer vapor, which is formed by atomizing and volatilizing the monomer by a feeding pump and can be introduced into the reaction chamber under a low pressure of 10 mTorr. The flow rate of the monomer vapor is 110 μL/min; and the flow rate of the carbon octafluoride and the nitrogen gas is 60 sccm.

In the step (2), the plasma discharge is used for the chemical vapor deposition. The plasma discharge process during the deposition is a continuous discharge, which specifically includes at least one time of the following deposition process: the deposition process includes the pretreatment stage and the coating stage. In the pretreatment stage, the plasma discharge power is 300 W, and the discharge duration time is 450 s. Then in the coating stage, the plasma discharge power is adjusted to be 200 W, and the discharge duration time is 1100 s.

In the step (2), the plasma discharge mode is a high frequency discharge.

(3) Post-Processing:

The introduction of the monomer vapor stops, and the plasma discharge stops at the same time. Continuously pumping to keep the vacuum degree of the reaction chamber being 10 mTorr. After one minute, air is introduced to get the pressure in the reaction chamber to be an atmospheric pressure, and then the substrate is taken out.

Embodiment 7

In this embodiment, the total thickness of the N-doped titanium dioxide anti-fog film layer prepared by the plasma enhanced chemical vapor deposition process is about 100 nm.

The hydrophilic anti-fog film layer can be prepared according to the following steps:

(1) Pretreatment:

A substrate is placed in the reaction chamber of the nano coating preparation equipment, and the reaction chamber is closed. Continuously pumping the reaction chamber to control the vacuum degree in the reaction chamber to be 10 mTorr, and the plasma source gas—the inert gas Ar is introduced into the reaction chamber. Then, the movement mechanism is started to make the substrate move in the reaction chamber.

In the step (1), the substrate is a product with anti-fog requirements and high surface energy treatment requirements made of metal, glass or polymer.

In the step (1), the reaction chamber is a rotary chamber with a volume of 500 L, the temperature of the reaction chamber is controlled at 45° C., and the flow rate of the inert gas is 60 sccm.

In the step (1), the substrate moves in the reaction chamber in the form of a circular motion relative to the reaction chamber, and the rotation speed is 6 revolutions/min.

(2) The Preparation of the N-Doped Titanium Dioxide Hydrophilic Anti-Fog Film Layer:

Tetrabutyl titanate (the titanium-oxygen organic compound of the titanium dioxide precursor source) and nitrogen gas (the non-metal doping source) are introduced into the reaction chamber. When the vacuum degree in the reaction chamber achieves 30 mTorr, the plasma discharge is started to perform the chemical vapor deposition to prepare the hydrophilic anti-fog film layer on the surface of the substrate.

The tetrabutyl titanate is a monomer vapor, which is formed by atomizing and volatilizing the monomer by a feeding pump and can be introduced into the reaction chamber under a low pressure of 10 mTorr. The flow rate of the monomer vapor is 120 μL/min; and the flow rate of the nitrogen gas is 60 sccm.

In the step (2), the plasma discharge is used for the chemical vapor deposition. The plasma discharge process during the deposition is a pulse discharge, which specifically includes at least one time of the following deposition process: the deposition process includes the pretreatment stage and the coating stage. In the pretreatment stage, the plasma discharge power is 300 W, and the discharge duration time is 450 s. Then in the coating stage, the plasma discharge power is adjusted to be 200 W, the duty cycle of the pulse is 10:100, and the discharge duration time is 3600 s.

In the step (2), the plasma discharge mode is a radio frequency discharge.

(3) Post-Processing:

The introduction of the monomer vapor stops, and the plasma discharge stops at the same time. Continuously pumping to keep the vacuum degree of the reaction chamber being 10 mTorr. After one minute, air is introduced to get the pressure in the reaction chamber to be an atmospheric pressure, and then the substrate is taken out.

Embodiment 8

In this embodiment, the total thickness of the C-doped titanium dioxide anti-fog film layer prepared by a plasma enhanced chemical vapor deposition process is about 90 nm.

The hydrophilic anti-fog film layer can be prepared according to the following steps:

(1) Pretreatment:

A substrate is placed in the reaction chamber of the nano coating preparation equipment, and the reaction chamber is closed. Continuously pumping the reaction chamber to control the vacuum degree in the reaction chamber to be 10 mTorr, and the inert gas He is introduced into the reaction chamber. Then, the movement mechanism is started to make the substrate move in the reaction chamber.

In the step (1), the substrate is a product with anti-fog requirements and high surface energy treatment requirements made of metal, glass or polymer.

In the step (1), the reaction chamber is a rotary chamber with a volume of 200 L, the temperature of the reaction chamber is controlled at 45° C., and the flow rate of the inert gas is 60 sccm.

In the step (1), the substrate moves in the reaction chamber in the form of a circular motion relative to the reaction chamber, and the rotation speed is 6 revolutions/min.

(2) The Preparation of the C-Doped Titanium Dioxide Hydrophilic Anti-Fog Film Layer:

Tetraisopropyl titanate (the titanium-oxygen organic compound of the titanium dioxide precursor source) and ethyne (the non-metal doping source) are introduced into the reaction chamber. When the vacuum degree in the reaction chamber achieves 30 mTorr, the plasma discharge is started to perform the chemical vapor deposition to prepare the hydrophilic anti-fog film layer on the surface of the substrate.

The tetraisopropyl titanate is a monomer vapor, which is formed by atomizing and volatilizing the monomer by a feeding pump and can be introduced into the reaction chamber under a low pressure of 10 mTorr. The flow rate of the monomer vapor is 110 μL/min; and the flow rate of the ethyne is 40 sccm.

In the step (2), the plasma discharge is used for the chemical vapor deposition. The plasma discharge process during the deposition is a pulse discharge, which specifically includes at least one time of the following deposition process: the deposition process includes the pretreatment stage and the coating stage. In the pretreatment stage, the plasma discharge power is 300 W, and the discharge duration time is 450 s. Then in the coating stage, the plasma discharge power is adjusted to be 200 W, the duty cycle of the pulse is 5:100, and the discharge duration time is 3600 s.

In the step (2), the plasma discharge mode is radio frequency discharge.

(3) Post-Processing:

The introduction of the monomer vapor stops, and the plasma discharge stops at the same time. Continuously pumping to keep the vacuum degree of the reaction chamber being 10 mTorr. After one minute, air is introduced to get the pressure in the reaction chamber to be an atmospheric pressure, and then the substrate is taken out.

The substrates after coating in the above embodiments were tested in thickness, water contact angle and light transmittance of the film layer.

The thickness of the nano film layers may be measured by a film thickness measuring instrument (USA, FilmetricsF20-UV).

The water contact angle of nano film layers may be tested according to GB/T 30447-2013.

The light transmittance of the nano film layers may be tested by an ultraviolet visible spectrophotometer (USA, Perkin Elmer Lambda 950).

| Performance of the Film Layer | | | |
|---|---|---|---|
| Embodiment | Thickness (nm) | Water Contact Angle (°) | Light Transmittance (%) |
| 1 | 100 | 7 | 91 |
| 2 | 90 | 9 | 92 |
| 3 | 120 | 9 | 92 |
| 4 | 90 | 8 | 90 |
| 5 | 20 | 10 | 93 |
| 6 | 30 | 10 | 92 |
| 7 | 100 | 8 | 90 |
| 8 | 90 | 10 | 91 |

Those skilled in the art will appreciate that, the embodiments of the present disclosure shown in the foregoing description and the accompanying drawings are by way of example only and are not intended to limit the present disclosure. The advantages of the present disclosure have been completely and effectively realized. The functionality and structural principles of the present disclosure have been shown and illustrated in the embodiments, and embodiments of the disclosure may be varied or modified without departing from the principles described herein.

The invention claimed is:

1. A hydrophilic anti-fog film layer, formed on a surface of a substrate by a plasma chemical vapor deposition using a titanium dioxide precursor source and a non-metal doping source as reaction raw materials, wherein the titanium dioxide precursor source comprises one or two selected from a group consisting of: a titanium-based source compound with an oxygen-based source, and a titanium-oxygen organic compound;

wherein the non-metal doping source is selected from a group consisting of: alkane, alkene, ethyne ($C_2H_2$), $C_xF_{2x+2}$, and $C_xF_{2x}$, wherein X is a number ranging from 1 to 6;

the plasma chemical vapor deposition is conducted at a pressure ranging from 10 mTorr to 300 mTorr and at a temperature ranging from 30° C. to 60° C., and the plasma chemical vapor deposition comprises a pretreatment stage and a coating stage, in the pretreatment stage, a plasma discharge power ranges from 150 W to 600 W, and a discharge duration time ranges from 60 s to 450 s, and then in the coating stage, the plasma discharge power ranges from 10 W to 200 W, and the discharge duration time ranges from 600 s to 7200 s; and a water contact angle of the hydrophilic anti-fog film layer under visible light is not greater than 10°, and the contact angle stays at an original level after being placed under visible light for 6 months.

2. The hydrophilic anti-fog film layer according to claim 1, wherein the titanium-oxygen organic compound has a structural formula TiX, and X is an alkoxy group.

3. The hydrophilic anti-fog film layer according to claim 1, wherein the titanium-based source compound has a structural formula TiY, and Y is a halogen.

4. The hydrophilic anti-fog film layer according to claim 2, wherein the titanium-oxygen organic compound comprises one or more selected from a group consisting of: tetrabutyl titanate, tetraisopropyl titanate, and ethyl titanate.

5. The hydrophilic anti-fog film layer according to claim 3, wherein the titanium-based source compound comprises titanium tetrachloride.

6. The hydrophilic anti-fog film layer according to claim 1, wherein the oxygen-based source comprises oxygen gas.

7. The hydrophilic anti-fog film layer according to claim 1, wherein a thickness of the hydrophilic anti-fog film layer ranges from 20 nm to 10 μm, and a hardness of the hydrophilic anti-fog film layer is HB-4H.

8. The hydrophilic anti-fog film layer according to claim 1, wherein a light transmittance of the hydrophilic anti-fog film layer is greater than 90%.

9. A preparation method of the hydrophilic anti-fog film layer claimed in claim 1, comprising:

forming a hydrophilic anti-fog film layer on a surface of a substrate by a plasma chemical vapor deposition using a titanium dioxide precursor source and a non-metal doping source as reaction raw materials in a PECVD device, wherein the titanium dioxide precursor source comprises one or two selected from a group consisting of: a titanium-based source compound with an oxygen-based source, and a titanium-oxygen organic compound;

wherein the non-metal doping source is selected from a group consisting of: alkane, alkene, ethyne ($C_2H_2$), $C_xF_{2x+2}$, and $C_xF_{2x}$, wherein X is a number ranging from 1 to 6;

the plasma chemical vapor deposition is conducted at a pressure ranging from 10 mTorr to 300 mTorr and at a temperature ranging from 30° C. to 60° C.; and a water contact angle of the hydrophilic anti-fog film layer under visible light is not greater than 10°, and the contact angle stays at an original level after being placed under visible light for 6 months.

10. The preparation method according to claim 9, wherein the substrate can be moved in a reaction chamber of the PECVD device, and a motion mode of the substrate comprises one or two selected from a group consisting of: a linear motion and a curvilinear motion.

11. The preparation method according to claim 9, wherein a plasma source gas is introduced before the reaction raw materials are introduced, and the plasma source gas comprises an inert gas.

12. The preparation method according to claim 11, wherein the plasma source gas is also used as the non-metal doping source.

13. The preparation method according to claim 9, wherein a temperature of the reaction chamber of the PECVD device is controlled to range from 30° C. to 60° C.

14. The preparation method according to claim 9, wherein the preparation method comprises a pretreatment stage and a coating stage, in the pretreatment stage, a plasma discharge power ranges from 150 W to 600 W, and a discharge duration time ranges from 60 s to 450 s, and then in the coating stage, the plasma discharge power ranges from 10 W to 200 W, and the discharge duration time ranges from 600 s to 7200 s.

15. The preparation method according to claim 9, comprising following three steps:

(1) pretreatment:

the substrate is placed in a reaction chamber of the PECVD device, a plasma source gas is introduced after pumping, and a motion mechanism is started to make the substrate move in the reaction chamber;

(2) deposition:

a titanium source, an oxygen source and the non-metal doping source are introduced into the reaction chamber, and a plasma discharge is started for chemical vapor deposition; and (3) post-processing:

the plasma discharge stops, an atmosphere is introduced to achieve an atmospheric pressure after pumping, the substrate stops moving, and then the substrate with the hydrophilic anti-fog film layer can be taken out.

16. A product with the hydrophilic anti-fog film layer claimed in claim 1, prepared by being exposed in an environment with a titanium dioxide precursor source and a non-metal doping source serving as reaction raw materials, wherein the hydrophilic anti-fog film layer is formed on at least a part of a surface of the product by a plasma chemical vapor deposition, wherein the titanium dioxide precursor source comprises one or two selected from a group consisting of: a titanium-based source compound with an oxygen-based source, and a titanium-oxygen organic compound;

wherein the non-metal doping source is selected from a group consisting of: alkane, alkene, ethyne ($C_2H_2$), $C_xF_{2x+2}$, and $C_xF_{2x}$, wherein X is a number ranging from 1 to 6;

the plasma chemical vapor deposition is conducted at a pressure ranging from 10 mTorr to 300 mTorr and at a temperature ranging from 30° C. to 60° C., and the plasma chemical vapor deposition comprises a pretreatment stage and a coating stage, in the pretreatment stage, a plasma discharge power ranges from 150 W to 600 W, and a discharge duration time ranges from 60 s to 450 s, and then in the coating stage, the plasma discharge power ranges from 10 W to 200 W, and the discharge duration time ranges from 600 s to 7200 s; and a water contact angle of the hydrophilic anti-fog film layer under visible light is not greater than 10°, and the contact angle stays at an original level after being placed under visible light for 6 months.

17. The product according to claim 16, wherein the product comprises one selected from a group consisting of: a glass product, a metal product, a ceramic product and a plastic product.

* * * * *